United States Patent [19]

Ryan

[11] 4,456,995
[45] Jun. 26, 1984

[54] APPARATUS FOR HIGH SPEED FAULT MAPPING OF LARGE MEMORIES

[75] Inventor: Philip M. Ryan, Hopewell Junction, N.Y.

[73] Assignee: International Business Machines Corporation, Armonk, N.Y.

[21] Appl. No.: 345,944

[22] PCT Filed: Dec. 17, 1981

[86] PCT No.: PCT/US81/01683
§ 371 Date: Dec. 18, 1981
§ 102(e) Date: Dec. 18, 1981

[87] PCT Pub. No.: WO83/02164
PCT Pub. Date: Jun. 23, 1983

[51] Int. Cl.³ .................. G01R 31/28; G06F 11/00
[52] U.S. Cl. .................................... 371/21; 371/5
[58] Field of Search ....................... 371/21, 25, 5

[56] References Cited

U.S. PATENT DOCUMENTS

| | | | |
|---|---|---|---|
| 3,659,088 | 4/1972 | Boisvert, Jr. | 371/21 |
| 3,940,601 | 2/1976 | Henry et al. | 371/21 |
| 4,039,813 | 8/1977 | Kregness | 371/16 |
| 4,061,908 | 12/1977 | de Jonge et al. | 371/21 |
| 4,066,880 | 1/1978 | Salley | 371/21 |

OTHER PUBLICATIONS

V. P. Srini, Fault Location in a Semiconductor Random-Access Memory Unit, IEEE Trans. on Computers, vol. C-27, No. 4, Apr. 1978, pp. 349-358.
D. J. Friend, Storage Checkout Method, IBM Technical Disclosure Bulletin, vol. 18, No. 3, Aug. 1975, pp. 930-932.

Primary Examiner—Charles E. Atkinson
Attorney, Agent, or Firm—Robert J. Haase

[57] ABSTRACT

Apparatus is disclosed for mapping and classifying the faulty bits of a large computer memory. Known data is read into the memory (1) and then the data stored in the memory is read out in a predetermined sequence (17, 18). The data read out is compared (10) with the known written data and the mismatches (errors) are counted (11, 12). Based upon the number of errors counted and the known sequence in which the stored data is read out, the type of fault is determined, e.g., a failure of an entire bit line, a failure of an entire word line, etc., and a status byte is established (7) representing the fault type. The status byte is useful in determining a reconfiguration of the memory whereby the faulty memory bits are scattered among accessed data words in such a way that available error correcting capability can correct the remaining faulty bits in each data word.

18 Claims, 4 Drawing Figures

APPARATUS FOR HIGH SPEED FAULT MAPPING OF LARGE MEMORIES

DESCRIPTION

1. Technical Field

The invention generally relates to apparatus for mapping the faults of a large memory, at high memory speeds, and for classifying the mapped faults by types, wherein the memory comprises an array of semiconductor chips and accessed data words comprise bits from respective chips.

2. Background Art

U.S. Pat. No. 3,704,363, assigned to the present assignee, teaches the automatic collection of error statistical information, arising out of computer system use, the error information being classified as to the number of correctible errors encountered. The specific types of errors encountered, however, are not discoverable from the simple counts of the numbers of correctable and uncorrectable errors. That is, one can not deduce from the simple counts whether the individual errors are related to each other or not, and if so, what the relationship is.

U.S. Pat. No. 4,174,537 discloses another error logging technique wherein separate records are made of single bit and multiple bit errors encountered in reading out data from addressed, selected locations in memory but, again, no indication is produced as to any relationship existing between the individual errors.

U.S. Pat. No. 3,917,933 describes yet another error logging scheme which keeps an accounting of the number of correctible errors experienced in the same word group accessed from memory. An alerting signal is generated when a preset threshold number of correctible errors has occurred in the same word group so that preventive maintenance can be scheduled before an uncorrectible error occurs in that word group. However, no attempt is made to monitor the relationship, if any, between the individual detected errors.

DISCLOSURE OF INVENTION

The invention as claimed in direction to the classification of memory array faults in terms of the relationship therebetween, i.e., types or mechanisms of those faults. More particularly, a fault map is made of the memory by writing known data into the memory and by reading the data out in a predetermined sequence while comparing the output data with the known written data and counting the mismatches (errors). The sequence is selected so that the memory array is scanned first by successive word lines and then by successive bit lines within each of a plurality of chips. Based upon the number of errors encountered as the array is scanned, and upon the known direction of scan, a decision is made as to the type of fault, e.g., a failure of an entire bit line, a failure of an entire word line, a failure of the entire array, or a failure of only isolated bits.

Where the memory comprises an array of semiconductor chips and accessed data words comprise bits from different respective chips, means are provided for selecting a column of chips and then testing each chip in the selected column by sequentially scanning it first by word lines and then by bit lines. The errors are counted in one or more registers, which accumulate total fault count and the count of consecutive faults in the direction scanned. Fault type, i.e., the relationship (if any) between the individual faults detected, is deduced from the fault counts in the registers, taking into account the direction in which the respective chip was scanned to produce the given count. A status word is formed for each chip representing the deduced fault type.

The knowledge or fault type facilitates the electrical reconfiguration of the memory so that the faulty bits are scattered between the accessed data words in such a way that available error correcting capability can correct the remaining faulty bits in each data word. Without knowledge of the fault types, and in the presence of numerous faulty bits, memory reconfiguration can not be accomplished with desired efficiency. The high speed with which fault types are classified in accordance with the present invention permits the completion of fault mapping with only a brief interruption, on the order of minutes, to the normal operation of the system. A time saving of two orders of magnitude can be realized relative to state-of-the-art mapping techniques in which a system interrupt is produced for each faulty bit encountered in scanning the memory.

BEST MODE FOR CARRYING OUT THE INVENTION

Figure 1:
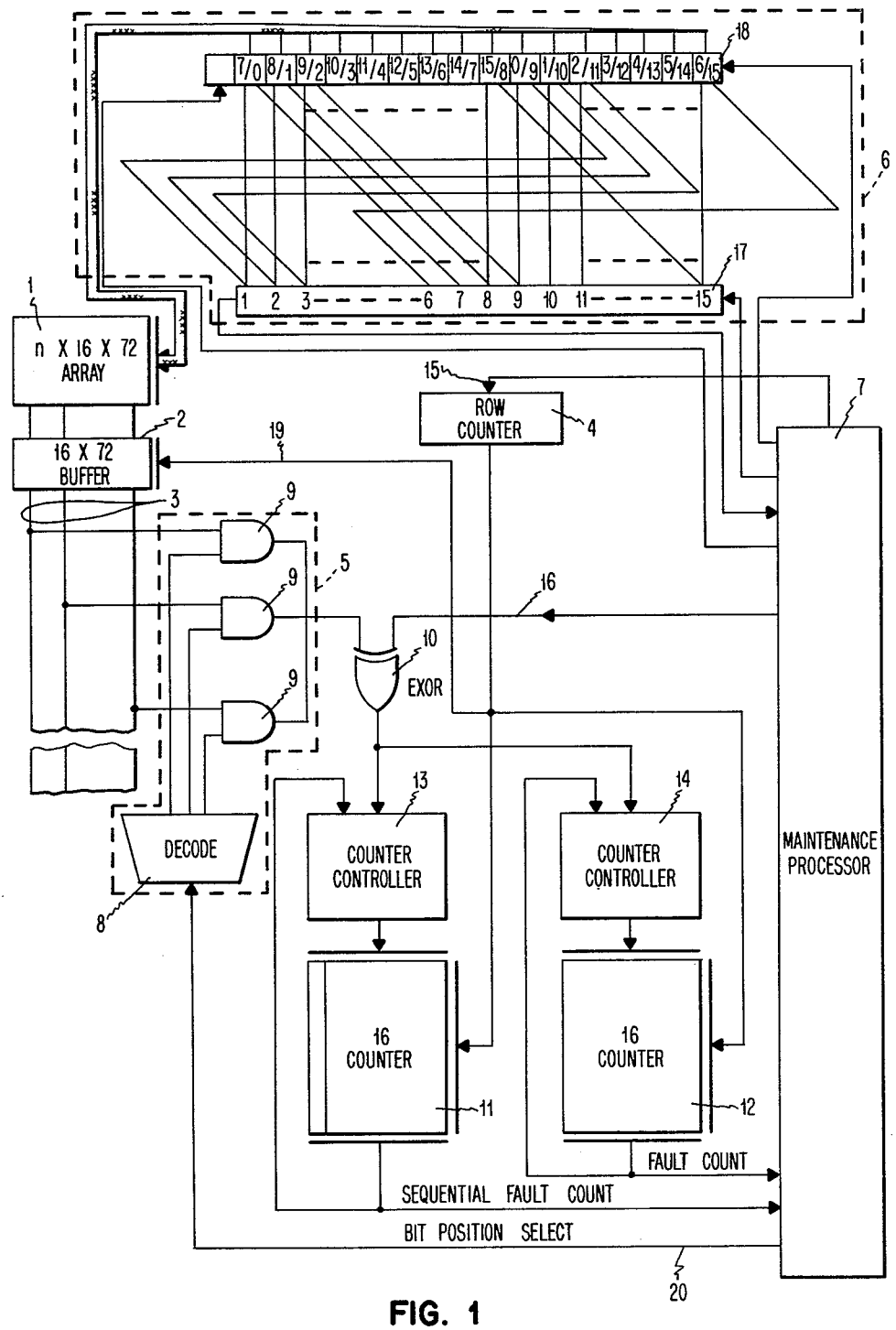
FIG. 1 is a block diagram of the best mode for carrying out the invention in which the direction of memory scan is factored into the determination of fault type.

The fault mapping of memory chip array 1, associated with conventional supporting components 2, 3 and 7 is accomplished, in accordance with the present invention, by the provision of the relatively modest additional memory controller hardware comprising row counter 4, address register 6, selector switching network 5, (comprising decoder 8 and AND gates 9), exclusive OR gate 10, counters 11 and 12 and associated adders 13 and 14. With the additional hardware, memory 1 can be mapped for errors and the errors can be classified as to types in the order of 100 times faster than earlier techniques wherein a diagnostic routine is run by the maintenance processor 7 and the maintenance processor is interrupted each time that an incorrect bit is encountered in the memory. Inasmuch as each interrupt takes several milliseconds to process and considering that the number of faulty bits in the memory may be in the hundreds of thousands, the mere acquisition of the raw, unsorted list of memory faults could take hours. Storing such a volume of data and then sorting it to identify which memory chips contain the errors and to determine the type of errors encountered, would require further considerable expenditure of time.

High speed memory mapping and error type classification, on the other hand, greatly facilitates the ability of field engineers to diagnose and repair memory faults and makes viable the automatic reconfiguration of memories so that existing faulty bits can be efficiently scattered among separately accessed data words whereby available error correcting circuitry can handle the residual faulty bits in each data word.

Referring to FIG. 1, memory chip array 1, in a typical instance, comprises an array of 2304 chips, each chip containing 64k bits (where k=1024). The array is organized in terms of 128k logical lines of 1152 bits each. Each line constitutes 16 doublewords of 72 bits each. Each chip provides only a single bit to any given doubleword.

When the chip array 1 is accessed, many of the chips (e.g., 1152 chips) are activated. One 1152 bit line of data is buffered, in terms of 16 doublewords of 72 bits each, by application to buffer 2. Each chip which supplies data to buffer 2 is accessed at the same cell location as determined by storage address register 6 under control of maintenance processor 7. Each of the buffered doublewords is made available, as 72 parallel bits, on memory bus 3 upon application of a respective double word identifier (DWID) address on line 19 from chip row counter 4 also under the control of processor 7 via line 15. This is conventional buffering practice to increase the effective bandwidth of memory array 1, composed of relatively slow-access array chips, by accessing a large number of the chips in parallel and storing the accessed data in buffer 2 for later transfer to bus 3.

In accordance with the present invention, once the data has been latched in the buffer, it is transmitted over the 72 bit bus 3 to selector switching network 5 in 16 sequential machine cycles in response to the DWID addresses on line 19. One of the 72 bits lines is selected by network 5 in response to a signal on line 20 from processor 7, and is applied jointly to exclusive OR gate 10 which also receives a binary one or binary zero value signal on line 16 from processor 7.

The signal on line 16 is determined in accordance with a blanket test pattern previously written in a conventional manner (not shown) into array 1 for fault mapping purposes as controlled by maintenance processor 7. Preferably the test pattern is all 1's or all 0's, however, other data patterns could be used. When the fault mapping operation is begun, maintenance processor 7 causes a blanket pattern of 1's or 0's to be written throughout array 1. The data is then read in a detailed sequential manner to be described below. Neglecting those details for now, after one logical line (1152 bits) of the blanket pattern is transferred from array 1 to buffer 2, the line is read out from buffer 2 in units of one doubleword (72 bits) at a time into network 5 for each DWID address applied via line 19. Network 5 selects one of the 72 bits for application to gate 10 wherein the selected bit of each doubleword, in turn, is compared with a signal representing the correct value thereof as applied via line 16 from maintenance processor 7.

The mismatch signal (representing a faulty bit) produced by gate 10 is applied jointly to counter controllers 13 and 14, each controller comprising an adder and an overflow detector. In addition, controller 13 includes a "zero reset" for resetting the selected counter to zero if the signal output from gate 10 indicates a match. One counter in each of counter groups 11 and 12 is selected by the DWID on line 19. Each counter group contains 16 counters corresponding, respectively, to the 16 doublewords in buffer 2. Accordingly, if the selected bit is faulty in the addressed doubleword of buffer 2, the counter corresponding to the addressed doubleword is incremented in each of the counter groups 11 and 12. Each counter of group 11, but not the counters of group 12, is reset each time that the match signal (denoting no error) is produced at the output of gate 10.

It should be noted that each DWID, in effect, identifies a respective row of 72 chips within array 1, each chip contributing one bit to the 72 bit doubleword applied to network 5. Exclusive OR gate 10 examines one bit at a time of the selected doubleword as the DWID address "ripples" through a group of 16 addresses. As each doubleword is placed on the bus (selected by the DWID), the bit position selected by the signal on line 20 is exclusive-OR'd with either a zero or a one, representing the data which was originally written throughout the memory and is the expected (correct) value of every bit being read. The result of the exclusive-OR is sent to the two counter groups 11 and 12. One of the counters in each group is selected based on the DWID value and is incremented by the result of the exclusive-OR. Thus the counters 12 count the total number of incorrect bits found in 16 chips in the memory.

The counters of group 12 are nominally 16 bits wide, plus overflow, to accumulate a maximum of 65536 fails, the number of bits in a chip. In practice, they could be restricted to, for example, 12 bits in width plus an overflow latch, since a chip with as many as 4096 bit-failures will normally be classified as a "massive fail". The counters of group 11 operate similarly but not identically to the counters of group 12. As each doubleword of the logical line appears on the bus, the DWID selects one of the 16 counters of group 11. If the result of exclusive-OR is a "1", the selected counter of group 11 is incremented; however, if the result is zero (indicating correct data readout), the selected counter is reset to zero. Each counter is nominally 7 bits wide, plus an overflow latch. This provides each counter with the ability to count up to 127 sequential fails, and to set its overflow latch on the 128th sequential fail. The overflow latch remains set even if the counter is reset to zero because of a zero result from the exclusive-OR. Thus, after reading the 64k bits of 16 chips, each overflow latch in counter group 11 indicates if there was any instance of 128 or more sequential failed bits read from each chip. If an overflow latch is set, it indicates that the corresponding chip had either a word-line fail or a bit-line fail, depending on the order in which the logical lines were read from memory.

Figure 2:
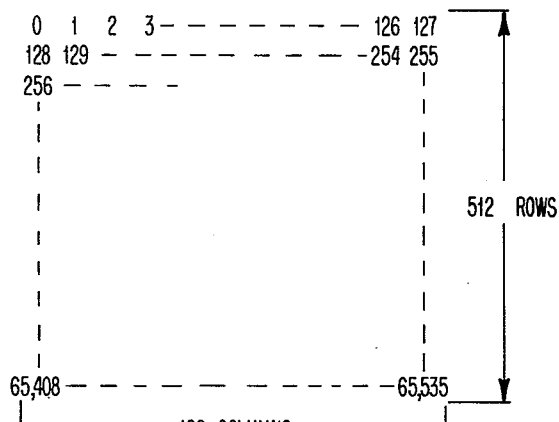
FIG. 2 is a diagram of a conventional assignment of cell addresses within the memory device.

The order in which the logical lines are read is controlled by the ROW/COLUMN SELECT logic. The specific manner of doing so depends on the organization of the rows and columns of cells in the array chips. In a typical example, the chips are organized as 512 rows of 128 columns each, and cell addresses are assigned as shown in FIG. 2.

Figure 3:
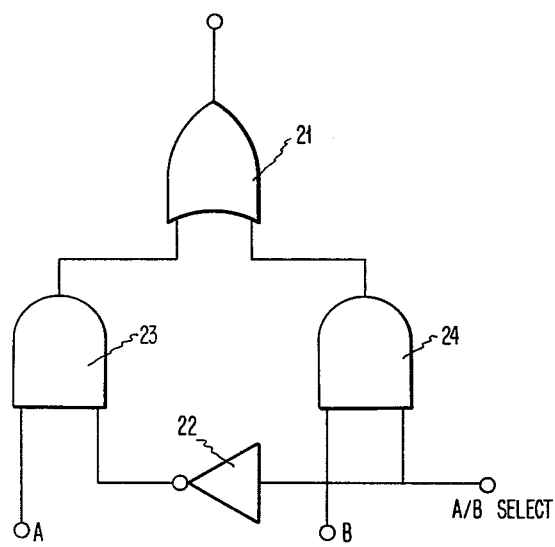
FIG. 3 is a block diagram of one of the multiplexor gates utilized in the embodiment of FIG. 1.
Figure 4:
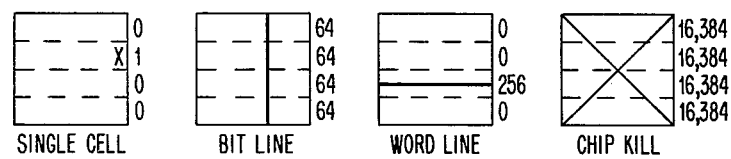
FIG. 4 is a diagram relating to an alternative embodiment in which limited areas of memory scan are factored into the determination of fault type.

A 16-bit counter, such as counter 17 of FIG. 1, is necessary to address all 64K cells. To read sequentially across each row, the addresses are presented in the order: 0, 1, 2, ... 126, 127, 128 ... 65534, 65535. To read sequentially down the columns, the addresses are presented in the order: 0, 128, 256, ... 65408, 1, 129, 257, ... 65407, 65535. These two different counting sequences are accomplished with 16 multiplexor gates contained within multiplexor-selector 18 of FIG. 1. Each multiplexor gate comprises AND gates 23 and 24, OR gate 21 and inverter 22 of FIG. 3.

In the B select mode, the multiplexor simply feeds the counter value directly to the address decoder (not shown) of array 1 so that, as the counter increments, the array address simply takes on the values 0, 1, 2, ... 127, 128, ... 65535. In the A select mode, however, the fastest changing bit of the counter, i.e., bit 15, is diverted for use as bit 8 in the array address (the other bits are similarly shifted), and the first 512 values of the array address are 0, 128, 256, ... 65408, as counter 17 is incremented.

The 513-th value of counter 17 is 512, represented by a 1 in bit position 6 and zeros in all other positions. In the A select mode, bit position 6 of the counter is used as bit position 15 of the array address, so the 513-th value of the array address is simply "1". It can be shown that the A select mode causes the array address to follow exactly the order shown above to read sequentially down the columns of cells in the chips.

On completion of one pass through one group of the lines of memory, each of the pairs of counters associated with the same chip is sensed and preferably encoded into a four bit "chip status" byte by maintenance processor 7 according to the following rules. If the bit-count (counter 12) is ≦7, that number becomes the status byte, with 0000 indicating a perfect (fault-free) chip. If counter 12 is >7, the high-order bit of the status byte is set. If the overflow latch of the counter 12 is set (or alternatively, if the count therein is greater than some large threshold), the second bit of the status byte is set. The overflow latch of counter 11 is set into either the third or the fourth bit position of the status byte, depending on the order in which the logical lines were read. If the other of reading the logical lines from memory was such that the chip bit-line addresses were incrementing slowly and word-line addresses were incrementing rapidly, the overflow latch of counter 11 is placed in the fourth bit position of the chip status byte. If the order of logical lines read was such that the chip word-line addresses were incrementing slowly and bit-line addresses were incrementing rapidly, the overflow latch of counter 11 is placed in the third bit position of the chip status byte.

The final status byte for each chip is constructed from the status bytes resulting from four complete passes through memory array 1, under the following conditions:

Memory written all zeros, read in order of rapidly advancing bit-line addresses Memory written all zeros, read in order of rapidly advancing word-line addresses Memory written all ones, read in order of rapidly advancing bit-line addresses Memory written all ones, read in order of rapidly advancing word-line addresses If all 4 status bytes have the high order bit equal to zero, then all four are "OR"d to produce the final status byte. If any of the four status bytes have high order bit equal to 1, then only those bytes having high-order bit equal to 1 are "OR"d together to produce the final status byte. This combination of the status bytes is also accomplished in the maintenance processor using conventional programming techniques.

The final status byte for each chip is interpretted as follows:

| | |
|---|---|
| 0000 | Perfect chip |
| 0001-0111 | chip has a few scattered bad cells |
| 1000 | chip has ≧8 scattered bad cells |
| 1001 | chip has one or a few wordline fails |
| 1010 | chip has one or a few bitline fails |
| 1011 | chip has a few wordline fails and a few bit line fails |
| 1100 | chip contains a large number of fails, but no complete WL or BL fails |
| 1101 | chip contains many fails, including some wordline fails |
| 1110 | chip contains many fails, including some bitline fails |
| 1111 | chip contains many fails in both dimensions. Could be a dead chip. |

In summary, maintenance processor 7 is programmed to supervise the fault mapping operation by directing the memory controller to carry out the following sequence of steps:

(1) The memory array 1 is cleared to all zeros for each group of 16 chips tested;
(2) the bit select switch network 5 is set to the selected position (one of 72 positions);
(3) the expected value (line 13) is set to zero;
(4) the counters 7 and 8 and their overflow latches are cleared;
(5) a section of memory 1 is read in the order of rapidly incrementing bit-line addresses in the manner previously described (covers all 64k addresses in each of 16 chips in one column of chips);
(6) 16 partial chip status bytes are encoded and stored;
(7) the bit select network 5 are set to the next sequential position;
(8) repeat (3)–(5) for the next group of 16 chips.
(9) repeat for all settings of the bit select network 5 (0–71).
(10) repeat (2)–(9) for the next section of the array 1;
(11) perform (2)–(10) except that the addressing order is such that word-line addresses are incrementing most rapidly in the manner previously described;
(12) set the contents of memory to all ones perform (2)–(11), except that the expected value on lines 13 is set to one; and
(13) combine the partial chip-status bytes according to the logic previously given to obtain 2304 chip status butes of four bits each.

The steps given above may be re-ordered to reduce the storage capacity needed for the partial chip status bytes, at the expense of writing all-zeros and all-ones into memory 1 more often.

It also should be apparent that trade-offs between time and hardware are available—the two groups 11 and 12 of 16 counters could be reduced to two registers and the remainder of the logic simplified at the expense of making 16 times as many accesses to memory 1. The time to acquire data on all of the chips in the array 1 would increase by a factor of 5 to 6 in this case. If time were the critical factor, more groups of counters could be run in parallel.

Alternatively, the amount of hardware required for identifying and classifying memory faults may be reduced by employing more software in the maintenance processor 7. This can be accomplished by recognizing that different types of faults that may occur in a chip produce different patterns of fault counts. FIG. 2 shows four types of common chip faults and the patterns of fault counts that they produce, in the given example, when counted by chip quadrants. The chip quadrants are identified by the dashed lines. The numerals represent the fault count found to exist in the respective quadrants. By simply counting up the total number of faults in each quadrant of each chip, one can easily identify which type of fault is present on a faulty chip. This leads to a very simple hardware implementation in which the two 16-word error counters of FIG. 1 are replaced with a single gated counter which is enabled only when one particular row of chips is activated. The maintenance processor identifies the row of interest with a line to the compare circuit and the counter is enabled only when the row counter address equals the selected row. The maintenance processor is interrupted and reads the counter each time the memory controller has cycled through a one-quadrant section of memory, i.e., 16,384 addresses. When the entire memory has been read twice, once with a blanket pattern of 1's written into it and once with a blanket pattern of 0's, the maintenance processor can combine the fault counts detected and determined what types of faults are present. However, the time required to build a fault map by means of the above-described alternative scheme is much greater than the time required using the hardware shown in FIG. 1.

It will be apparent to those skilled in the art that certain details have been omitted such as the straightforward techniques for programming maintenance processor 7 to carry out the described rules for forming the status bytes based upon the values of the counts resulting in the counter groups 11 and 12, such state-of-the-art details forming no part of the present invention.

I claim:

1. A computer memory system comprising an array of chips (1), each said chip comprising an array of signal storage locations (FIG. 2), into which known data is introduced, means including processor means (7) for comparing (10) data read from said locations with said known data to determine the presence of faulty stored data, characterized by means (7, 6, 2, 3, 5) including said processor means for reading from said locations in a predetermined sequence, said means for comparing being connected to the last named means, first means (12, 14, 4) connected to said means for comparing and to said processor means (7) for counting a first number of faulty data read from the totallity of said locations, and second means (11, 13, 4) connected to said means for comparing and to said processor means (7) for counting a second number of sequential faulty data read from said locations, said processor means (7) receiving signals from said first (12, 14, 4) and second means (11, 13, 4) representing said first and second numbers for determining therefrom and from said predetermined sequence the type of said faulty data.

2. The memory defined in claim 1 wherein said locations lie along word lines and said predetermined sequence is by successive word lines.

3. The memory defined in claim 1 wherein said locations lie along bit lines and said predetermined sequence is by successive bit lines.

4. The memory defined in claim 1 wherein said locations lie along word lines and bit lines and said predetermined sequence alternatively is by successive word lines and by successive bit lines.

5. The memory defined in claim 1 wherein said known data is all of the same binary type.

6. The memory defined in claim 1 wherein said second means for counting faulty data is reset each time that correct data is read out from one of said locations.

7. The memory defined in claim 1 wherein the number of faulty data is counted in two counters (11, 12), one (11) of which is reset each time that correct data is read out from one of said locations.

8. The memory defined in claim 1 wherein the number of faulty data is counted in two counters (11, 12), one (12) of which counts the total number of faulty data read outs and the other (11) of which counts the number of sequential faulty data read outs.

9. The memory defined in claim 1 wherein said processor means produces a status byte representing said type of said faulty data.

10. A computer memory system comprising
an array of chips, each said chip comprising an array of signal storage locations, into which known data is introduced,
means including processor means for comparing data read from said locations with said known data to determine the presence of faulty stored data,
means including said processor means for reading from said locations in a predetermined sequence,
said means for comparing being connected to the last named means, first means connected to said means for comparing and to said processor means for counting a first number of faulty data read from the totallity of said locations, and second means connected to sid means for comparing and to said processor means for counting a second number of sequential faulty data read from said locations,
said processor means receiving signals from said first and second means representing said first and second numbers for determining therefrom and from said predetermined sequence the type of said faulty data.

11. The memory defined in claim 10 wherein said locations lie along word lines and said predetermined sequence is by successive word lines.

12. The memory defined in claim 10 wherein said locations lie along bit lines and said predetermined sequence is by successive bit lines.

13. The memory defined in claim 10 wherein said locations lie along word lines and bit lines and said predetermined sequence alternatively is by successive word lines and by successive bit lines.

14. The memory defined in claim 10 wherein said known data is all of the same binary type.

15. The memory defined in claim 10 wherein said second means for counting faulty data is reset each that that correct data is read out from one of said locations.

16. The memory defined in claim 10 wherein the number of faulty data is counted in two counters, one of which is reset each time that correct data is read out from one of said locations.

17. The memory defined in claim 10 wherein the number of faulty data is counted in two counters, one of which counts the total number of faulty data read outs and the other of which counts the number of sequential faulty data read outs.

18. The memory defined in claim 10 wherein said processor means produces a status byte representing said type of said faulty data.

* * * * *